(12) United States Patent
Margalit

(10) Patent No.: US 9,548,434 B2
(45) Date of Patent: Jan. 17, 2017

(54) WAFER LEVEL PACKAGING OF ELECTRONIC DEVICE

(71) Applicant: VIAGAN Ltd., Zichron Yaaqov (IL)

(72) Inventor: Mordechai Margalit, Zichron Yaakov (IL)

(*) Notice: Subject to any disclaimer, the term of this patent is extended or adjusted under 35 U.S.C. 154(b) by 0 days.

(21) Appl. No.: 14/925,293

(22) Filed: Oct. 28, 2015

(65) Prior Publication Data

US 2016/0111616 A1   Apr. 21, 2016

Related U.S. Application Data

(63) Continuation-in-part of application No. 14/872,646, filed on Oct. 1, 2015.

(60) Provisional application No. 62/060,196, filed on Oct. 6, 2014, provisional application No. 62/068,650, filed on Oct. 25, 2014.

(51) Int. Cl.

| | |
|---|---|
| *H01L 33/62* | (2010.01) |
| *H01L 33/56* | (2010.01) |
| *H01L 33/50* | (2010.01) |
| *H01L 33/58* | (2010.01) |
| *H01L 33/48* | (2010.01) |
| *H01L 23/498* | (2006.01) |
| *H01L 33/54* | (2010.01) |
| *H01L 23/31* | (2006.01) |
| *H01L 21/48* | (2006.01) |
| *H01L 21/56* | (2006.01) |

(52) U.S. Cl.
CPC .......... *H01L 33/62* (2013.01); *H01L 21/481* (2013.01); *H01L 21/486* (2013.01); *H01L 21/565* (2013.01); *H01L 23/3114* (2013.01); *H01L 23/49827* (2013.01); *H01L 33/483* (2013.01); *H01L 33/507* (2013.01); *H01L 33/54* (2013.01); *H01L 33/56* (2013.01); *H01L 33/58* (2013.01); *H01L 2224/18* (2013.01); *H01L 2933/005* (2013.01); *H01L 2933/0033* (2013.01); *H01L 2933/0066* (2013.01)

(58) Field of Classification Search
CPC ...... H01L 33/62; H01L 21/565; H01L 33/507; H01L 33/58; H01L 33/483; H01L 23/49827; H01L 33/54; H01L 23/3114; H01L 23/49833; H01L 23/49838; H01L 23/49894; H01L 21/481; H01L 21/486; H01L 33/56
USPC .............................................. 257/98; 438/26
See application file for complete search history.

(56) References Cited

U.S. PATENT DOCUMENTS

2013/0161670 A1*   6/2013   Peng ................. H01L 33/647
                                                       257/98

* cited by examiner

*Primary Examiner* — Walter H Swanson
(74) *Attorney, Agent, or Firm* — Smith Tempel Blaha, LLC; Gregory S. Smith

(57) ABSTRACT

Wafer level packaging of LED devices is accomplished using a bottom wafer that includes one or more vias. A passivation layer is placed over the top surface of the bottom wafer including the surface of the vias. Metal pads are placed on the top surface of the passivation layer and extend to the bottom of the vias. Bond pads are then associated with the metal pads and ultimately used in attaching an LED device bottom wafer assembly. An encapsulation layer is applied and in contact with the LED device and a top wafer is attached to the encapsulation layer. The thickness of the bottom wafer is reduced, removing the lower portion to expose the metal pads at the bottom of the vias. An isolation layer is applied to the bottom wafer and holes are formed in the isolation layer to expose the metal pads. Electroplated structures are in contact with the isolation layer and in contact with the exposed metal pads.

20 Claims, 20 Drawing Sheets

WAFER LEVEL PACKAGING OF ELECTRONIC DEVICE

TECHNOLOGY FIELD

The present method and device relate to the packaging of electronic devices while providing external physical connections to the electronic device such as electrical connections, thermal connections and optical connections.

BACKGROUND

Electronic components such as transistors, MEMs, LEDs, diodes, or more complex integrated circuits are manufactured from semiconductor wafers using chemical processing techniques. Packaging of the devices is done by encapsulating the devices with protective covers while providing for physical connections between the device and the environment. Examples of physical connections include;
- Electrical connection to provide current or voltage for device operation
- Thermal connection to dissipate heat from the device
- Optical connection to extract light from devices such as light emitting diodes, or to provide light for devices such as image sensors
- To provide a physical connection to the device for measurement of external physical parameters such as pressure, temperature, humidity, acceleration, rotation, ambient light, etc.
- State of art methods to package devices include
- Connecting the device to metal lead frames and over molding with a polymer
- Connecting the device to a polymer, glass fiber or ceramic substrate and over molding with a polymer
- Chip scale packaging where the device electrical connections are extended using an overlay of deposited metal and protective polymer coating These methods suffer from high production cost, large form factor and poor dissipation of the heat generated during the operation of the device. The heat dissipation of electronic devices is a major impediment in next generation electronics. As the density of components increases, the energy density increases. To prevent component failures enhanced heat dissipation is required.

Patent Cooperation Treaty publication WO/2014/064541 and WO/2011/033516 to the same assignee disclose a process for wafer packaging method of LEDs. The process described in the publications is based on a "via last" process flow. The via in the bottom wafer, which provides a route for the electrical contact from one face of the bottom wafer, to the other face of the bottom wafer, is done after the attachment of the LED and in the last stages of the wafer level packaging process. The "via last" process flow requires complex processing of the bottom wafer which can increase the cost of the package and reduce yield and applications. An alternative method described below is a "via first" process flow. The "via first" process flow offers several advantages in addition to simplifying the process flow as it can also enable integration of electronics in the packaging procedure.

GLOSSARY

Wafer as used in the current disclosure means a semiconductor, polymer, metal, glass, quartz, or ceramic wafer used for the packaging of electronic devices. The wafer is typically round with a diameter of 150, 200, 300 or 450 mm and thickness of 200 micron to 1000 micron.

LED as used in the current disclosure means a light emitting diode composed of at least a "n" doped conducting layer, an intrinsic light emitting layer, a "p" doped conducting layer, and a substrate material such as Sapphire, GaN, InGaN, or GaAs Die as used in the current disclosure means a single LED.

Bottom wafer as used in the current disclosure means a wafer to which the LEDs are attached.

Electrical pad as used in the current disclosure means a metal coated or otherwise electrically conducting enclosed area located on the LED which provides an electrical connection to either the "p" or "n" doped layers.

Metal pad as used in the current disclosure means an enclosed area on the wafer covered with a metal such as Aluminum, Copper, Gold, Nickel, Titanium, Chrome, Silver or combinations thereof or other metals.

Bonding pad as used in the current disclosure means a metal pad or a portion of a metal pad composed of materials which facilitate an electrical, thermal and mechanical connection between the LED and bottom wafer.

Encapsulation layer as used in the current disclosure means a layer of optically transparent material which is in contact with the LED and metal pad.

Bonding layer as used in the current disclosure means a layer of optically transparent material which is in contact with the encapsulation layer.

Top wafer as used in the current disclosure means a wafer which is in contact with the bonding layer.

Cover wafer as used in the current disclosure means either a top or bottom wafer.

Via as used in the current disclosure means a pass through hole from one face of a wafer to the second opposing face of the wafer.

Blind via as used in the current disclosure means a hole in one face of a wafer which does not exit at the second opposing face of the wafer.

An electroplated structure as used in the current disclosure means an enclosed area which is composed of at least two layers; a first layer is a metal seed layer and the second layer is an electroplated metal layer.

Isolation layer as used in the current disclosure means a dielectric layer covering a wafer and used for electrical isolation of the wafer from the electroplated structure Passivation layer as used in the current disclosure means a dielectric layer covering a wafer and used for electrical isolation of the wafer from the electroplated structure Encapsulation layer as used in the current disclosure means a layer of material which is in contact with the LED, and metal pads. In some examples the encapsulation layer can be in contact with the LED, wafer, and metal pads.

Bonding layer as used in the current disclosure means a layer used to attach the top cover wafer to the encapsulation layer

DESCRIPTION

Wafer Level Packaging is a technique where multiple semiconductor devices are packaged in parallel. The devices are assembled on a wafer substrate and the processes detailed below are conducted on the devices. The wafers are typically Silicon or Glass wafers. While the packaging process is drawn and described for a single die, the process occurs in parallel for all dies on the wafer. More ever, compound modules in which electrical connections between one or more semiconductor devices can be created using the described processes.

Patent Cooperation Treaty publication WO/2014/064541 and WO/2011/033516 to the same assignee disclose a process for wafer packaging method of LEDs. The process described in the publications is based on a "via last" process flow. The via in the bottom wafer, which provides a route for the electrical contact from one face of the bottom wafer, to the other face of the bottom wafer, is done after the attachment of the LED and in the last stages of the wafer level packaging process. The "via last" process flow requires complex processing of the bottom wafer which can increase the cost of the package and reduce yield and applications. An alternative method described below is a "via first" process flow. The "via first" uses flip chip LEDs an example of which is shown in FIG. 1.

Figure 1:
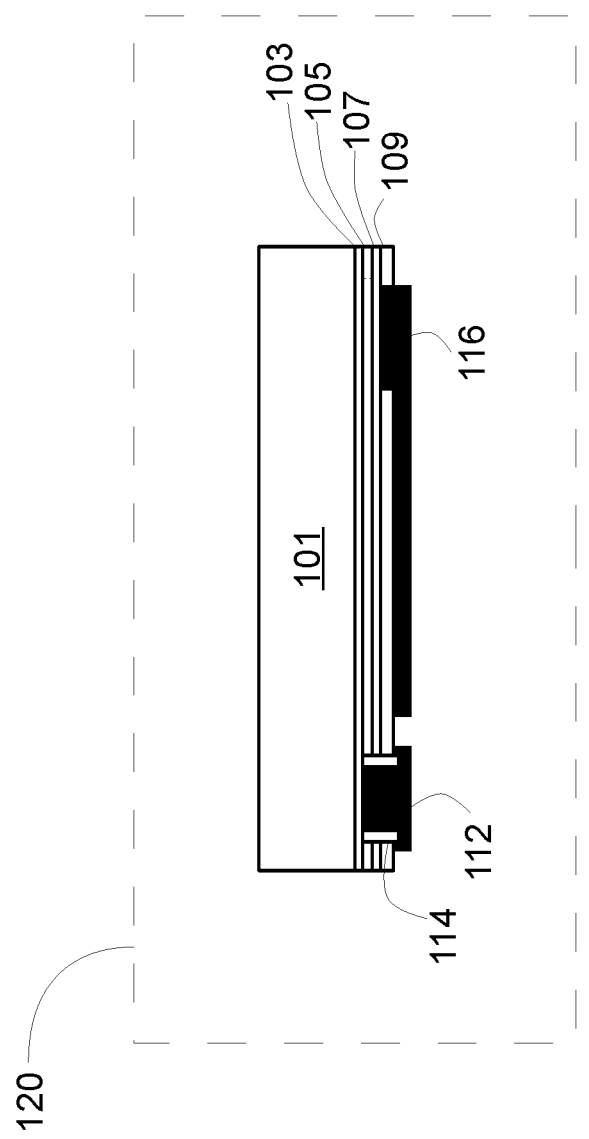
FIG. 1 shows an example of a LED.

FIG. 1 shows an example of a flip chip LED (120). The LED (120) is composed of various electrical pads and structures (101, 103, 105, 107, 109, 112, 114, 116). The substrate (101) is the base material on which the semiconductor layers are deposited. The substrate (101) is in one example composed of Sapphire and in another example composed of Silicon Carbide or Gallium Nitride. In another example the substrate (101) could have been removed resulting in a diode without a substrate. This is common in Gallium Nitride on Silicon LED manufacturing. In this case Layer 101 is Gallium Nitride or compositions including Gallium Nitride such as Indium Gallium Nitride. Layers 103, 105 and 107 are examples of functional layers. In one example layer 103 can be a "p" doped semiconducting layer, layer 105 an intrinsic light emitting layer and 107 an "n" doped semiconductor layer. In another example the layer order can be reversed or additional layers included. For example additional layers can include or incorporate, heterostructure, Quantum well or Quantum dot layers for enhancing the electrical or optical performance. To prevent a short circuit between electrical pad and other LED layers a passivation material (109, 114) is applied on any exposed layers of the LED. For example the passivation material (109, 114) can be composed of Silicon dioxide. Holes in the passivation material (109, 114) enable selective contact to the LED layers (103, 105, 107). Structures 112 and 116 are electrical pads. In a flip chip LED, both pads are located at a similar height. In one example the electrical pads (112, 116) can be fabricated from any of Gold, Tin, Silver, Aluminum, Titanium, Chromium, Copper, Indium, Germanium or combinations of these metals. An electrical pad (112, 116) makes a contact to one of the doped layers (103,107) and is isolated from the other layers due to the passivation material (109, 114). The LED (120) of FIG. 1 is assembled on a bottom wafer. A portion of the bottom wafer is shown in FIG. 2.

Figure 2:
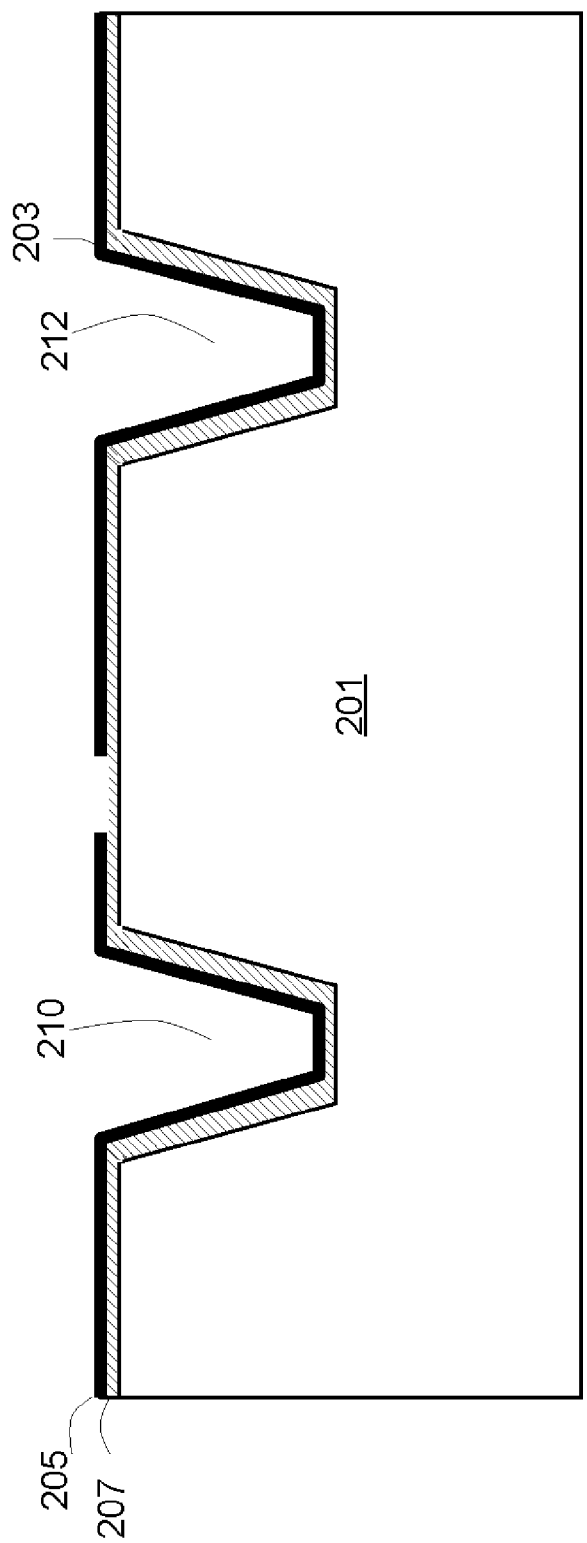
FIG. 2 shows an example of a portion of the bottom wafer with metal pads.

FIG. 2 shows an example of a portion of the bottom wafer (201) with a passivation layer (207) and metal pads (203, 205). FIGS. 2, 3A, 3B and 4 show a process of building of a wafer assembly to which the LED device can be attached. The wafer has holes (210, 212) in its top surface. The holes (210, 212) form blind vias (and such holes are also referred to as blind vias herein) as they don't extend to the bottom surface. One example of a process to obtain the wafer structure as shown in FIG. 2 is composed of the following steps; starting from a blank Silicon wafer (201), the top surface is covered with a photo resist material; holes are defined in the photoresist using a mask and imaging system; the wafer material is etched creating the hole structures (210,212); the wafer material is covered with a passivation layer (207); the passivation layer (207) is covered with a metal layer; the metal layer is covered with a photo resist; the photo resist is patterned to define metal pads (203, 205); the metal layer is etched leaving the metal pads (203, 205). An example of a wafer is a Silicon wafer. Other examples include Ceramic wafers, glass wafers, or structures made from polymer materials or glass fiber and Epoxy compounds. The depth of the holes (210, 212) in the wafer needs to be greater than the target thickness of the wafer. In one example the initial wafer thickness is 700 micron. The wafer will later be reduced to a thickness of 100 micron. In this example the hole depth should be greater than 100 micron. In another example the target thickness of the wafer is 80 micron and the hole depth should be greater than 80 micron. Examples of limitations on the hole depth will be discussed later. The hole can have walls with an angled slope or have walls with a 90° slope. In Silicon wafers the hole can be created using reactive ion etching (ME), deep reactive ion etching (DRIE) or various wet etching techniques such as KOH or TMAH etching. The hole width can be from 10 micron to 700 micron. The dimensions depend on the metal layers and the target electrical resistance. For small resistance it is desired to have metal layers with greater than 10 micron thickness so the holes should be larger than 25 micron. The holes can be of any shape. Examples of passivation layer (207) can include Silicon Nitride, Silicon dioxide, Silicon Carbide, Titanium Oxide, Aluminum Oxide or polymer materials. An example of a metal layer can be Aluminum (Al) layer deposited by Sputtering. The metal layer can include layers for adhesion such as Titanium, Chromium, or compositions of such materials. Another example of a metal layer can be Silver (Ag) deposited by Sputtering, evaporation or electroless plating. Additional metal layers include Gold (Au). In one example the metal layers can also include dielectric layers to enhance the optical reflection. An example of a dielectric material can be Magnesium Fluoride to enhance the performance of Aluminum for UV light reflection. Other examples include Titanium Oxide, Aluminum Fluoride, Aluminum Oxide, and Selenium. In another example the metal or dielectric layers can include optical structures to enhance light emission, or reflect the light in a specific manner. Examples of such structures include optical bead like structures, retro reflectors, micro prisms or gratings.

Figure 3A:
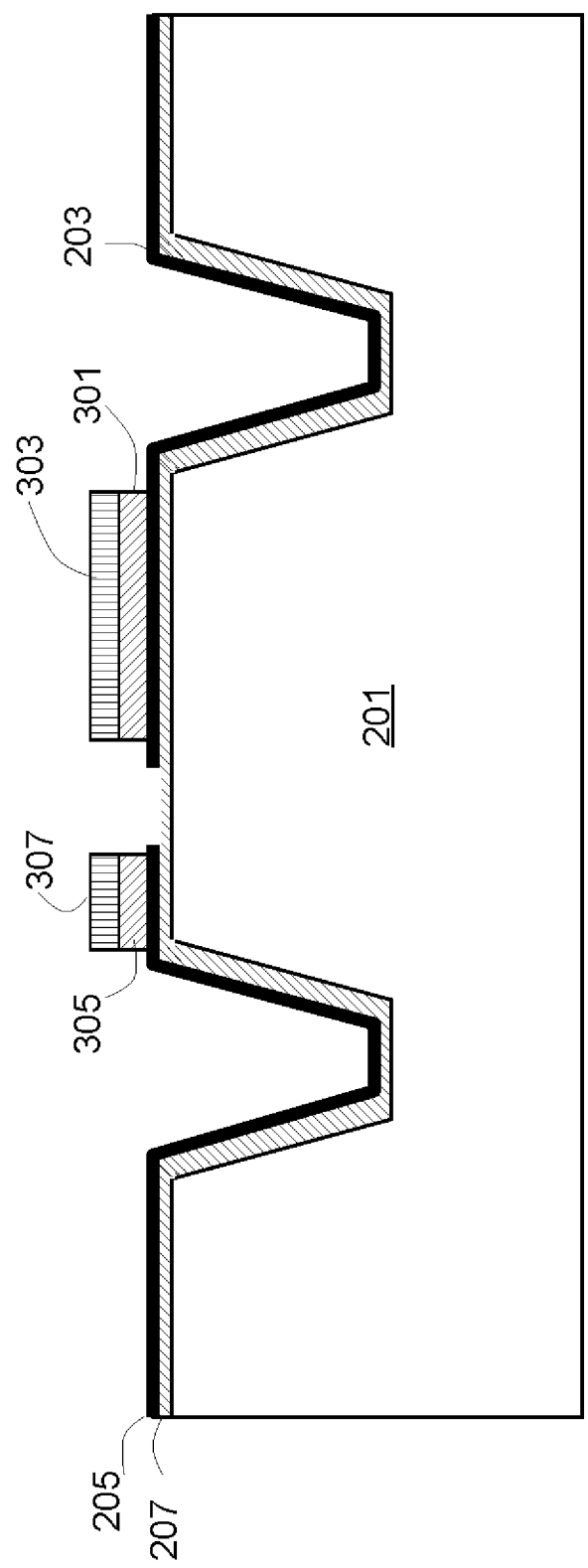
FIG. 3A shows an example of a portion of the bottom wafer with metal pads and bonding pads.

FIG. 3A shows an example of a portion of the bottom wafer (201) with metal pads (203, 205) and bonding pads (301, 303, 305, 307). The bonding pads will connect the LED of FIG. 1 to the wafer of FIG. 2. The bonding pads include materials which will soften or liquefy at an elevated temperature. After they solidify they will form a bond which provides an electrical, thermal and mechanical connection between the LED (FIG. 1) and the wafer (FIG. 2). In one example the bonding pads are composed of layers of different metals. When the metals are heated they melt and diffuse into each other. The resulting melt is then solidified. The combined metal has a higher melting temperature than the original layers forming a eutectic bond. An example of such metal layers is Gold Tin (AuSn). Another example is Copper Tin. Additional examples can include combination of Gold, Tin, Indium, Copper, Germanium, Silver and Aluminum. One example and method of fabrication is; a photo resist layer is deposited on the metal pads (203, 205); the photoresist is patterned with holes which are the targeted bonding pads (301, 303, 305, 307); The bonding pads are deposited using electroplating; first the copper bonding pad is deposited (301, 305); then the Tin bonding pad (303, 307) is deposited on top of the Copper bonding pad (301, 303); the photo resist is than removed leaving the bonding pads (301, 303, 305, 307).

Figure 3B:
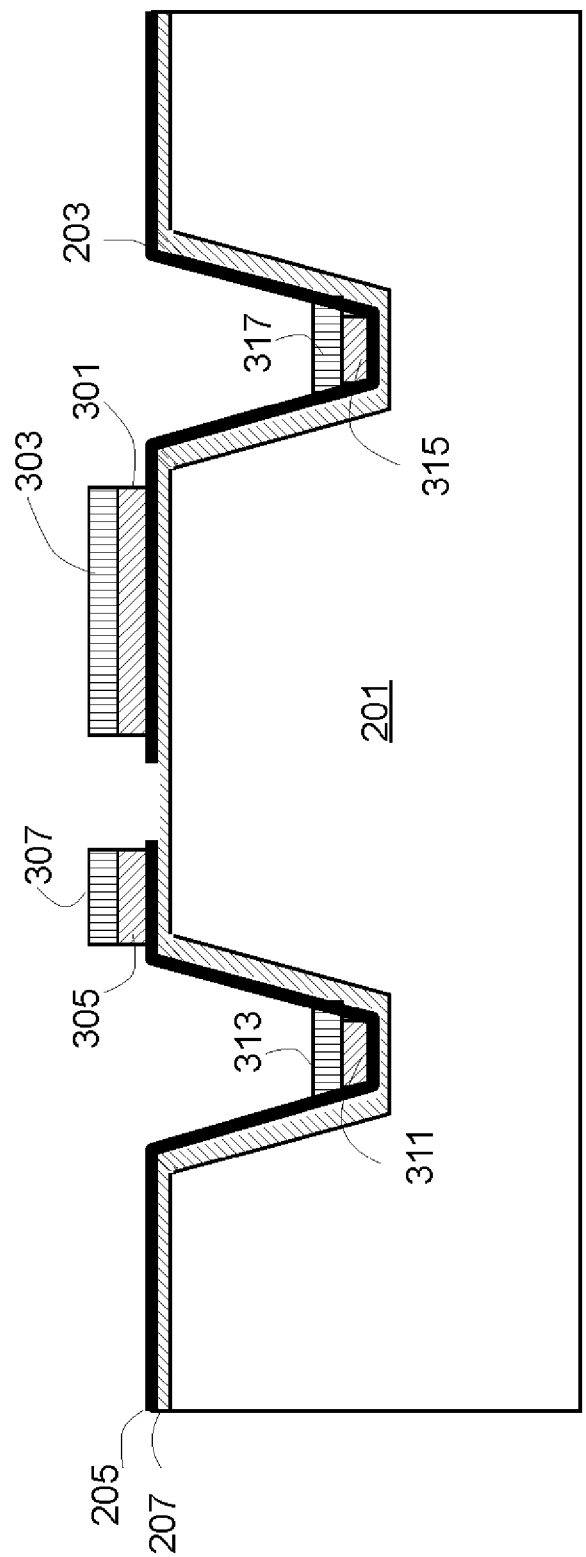
FIG. 3B shows another example of a portion of the bottom wafer with metal pads and bonding pads.

FIG. 3B shows an example of a portion of the bottom wafer (201) with metal pads (203, 205) and bonding pads (301, 303, 305, 307). The difference between FIG. 3A and FIG. 3B is structures (311, 313, 315, 317). These structures are obtained by depositing the bond pad material inside the holes. The purpose of structures (311, 313, 315, 317) is to increase the thickness of the metal pad (203, 205) in the hole (210, 212 in FIG. 2). In one example to obtain structures (311, 313, 315, 317) the method of fabrication described above for FIG. 3A is amended as follows. A photo resist layer is deposited on the metal pads (203, 205); the photoresist is patterned with holes which are the targeted bonding pads (301, 303, 305, 307) as well as the structures in the holes (210, 212 in FIG. 2); The bonding pads are deposited using electroplating; first the copper bonding pad is deposited (301, 305) and a Copper structure in the hole (311, 315); then the Tin bonding pad (303, 307) is deposited on top of the Copper bonding pad (301, 303) and a Tin structure (313, 317) is deposited on top to the Copper structure in the hole (311, 315); the photo resist is than removed leaving the bonding pads (301, 303, 305, 307) and structures (311, 313, 315, 317). Either example, FIG. 3A or FIG. 3B can be used interchangeably in the following steps.

Figure 4:
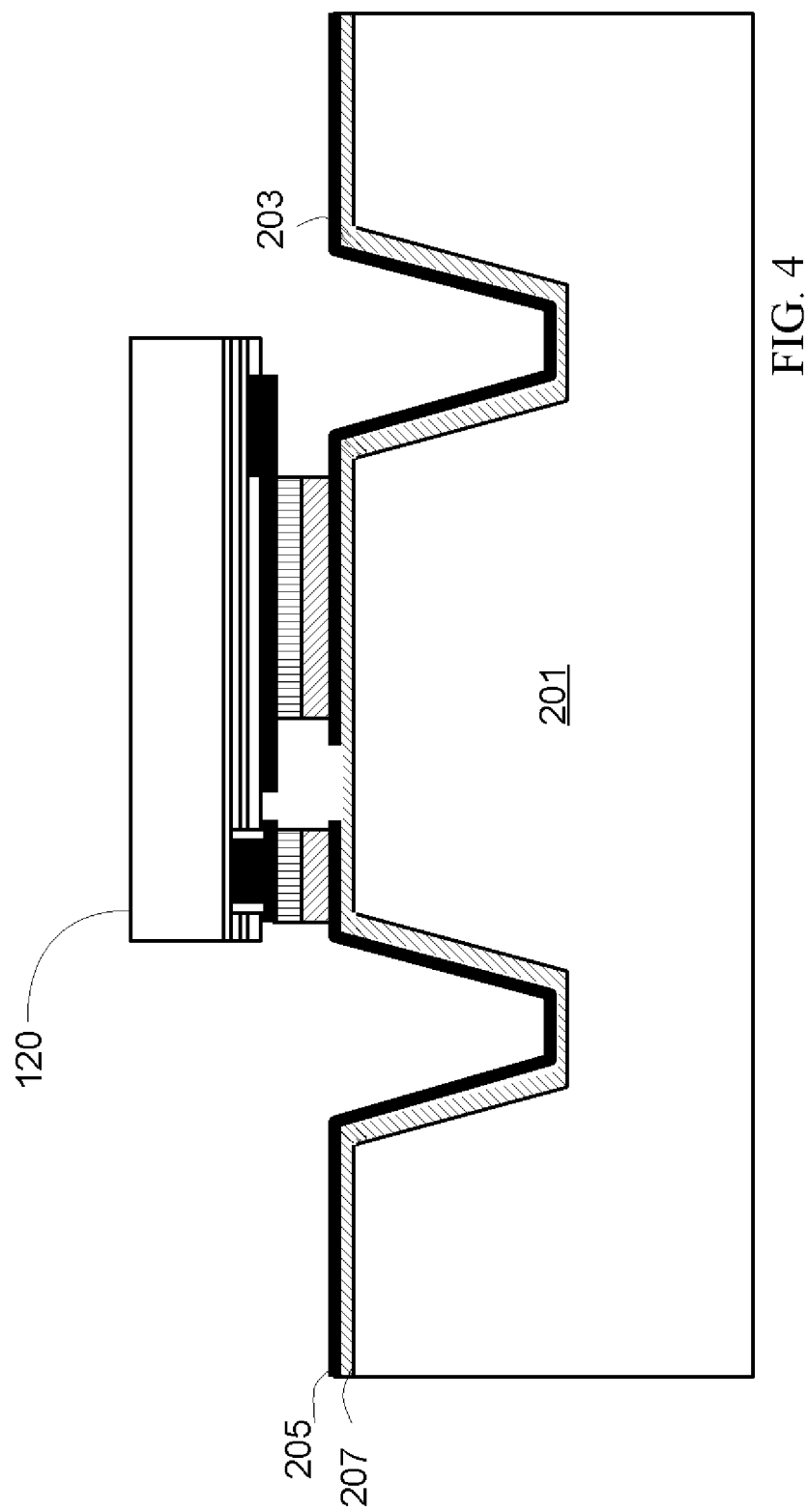
FIG. 4 shows an example of a LED bonded to a portion of the bottom wafer.

FIG. 4 shows an example of a LED (120) bonded to a portion of the bottom wafer (201). The LED (120) is the LED described in FIG. 1. The metal pads (112, 116 in FIG. 1) are fabricated from metals which are complementary to the bonding pads (301, 303, 305, 307 in FIG. 3) on the bottom wafer (201). As an example, in case of Eutectic Gold Tin bonding, the metal pads (112, 116 in FIG. 1) would be fabricated from Gold or Gold and Tin, where the eutectic ratio is determined by the materials in both LED as well as wafer pads. In another example, the LED metals pads (112, 116 in FIG. 1) can be composed of Gold or Tin or combination of Gold and Tin and the bonding pads (301, 303, 305, 307 in FIG. 3) would be composed of Copper and Tin.

The bonding process is done by placing the LED (120) on the pads and heating the wafer locally or globally to the melting temperature. In one example the LEDs (120) would be placed on the complete bottom wafer (201). After placement, the bottom wafer (201) is heated in a reflow oven at the melting temperature of the metal combination. The melting attaches the LEDs (120) to the wafer (201). After heating, the wafer is cooled and the LEDs are now attached. As an example the metal composition can be Gold and Tin and the heating temperature is 280-310° C. This process is known as Gold Tin Eutectic bonding. In another example the materials can include Tin and Copper, the heating temperature is 230-300° C. and the process is known as Transient Liquid Phase bonding. In another example which is not previously described, the materials can be Copper, Gold and Tin and the heating temperature can be 230-300° C.

Figure 5A:
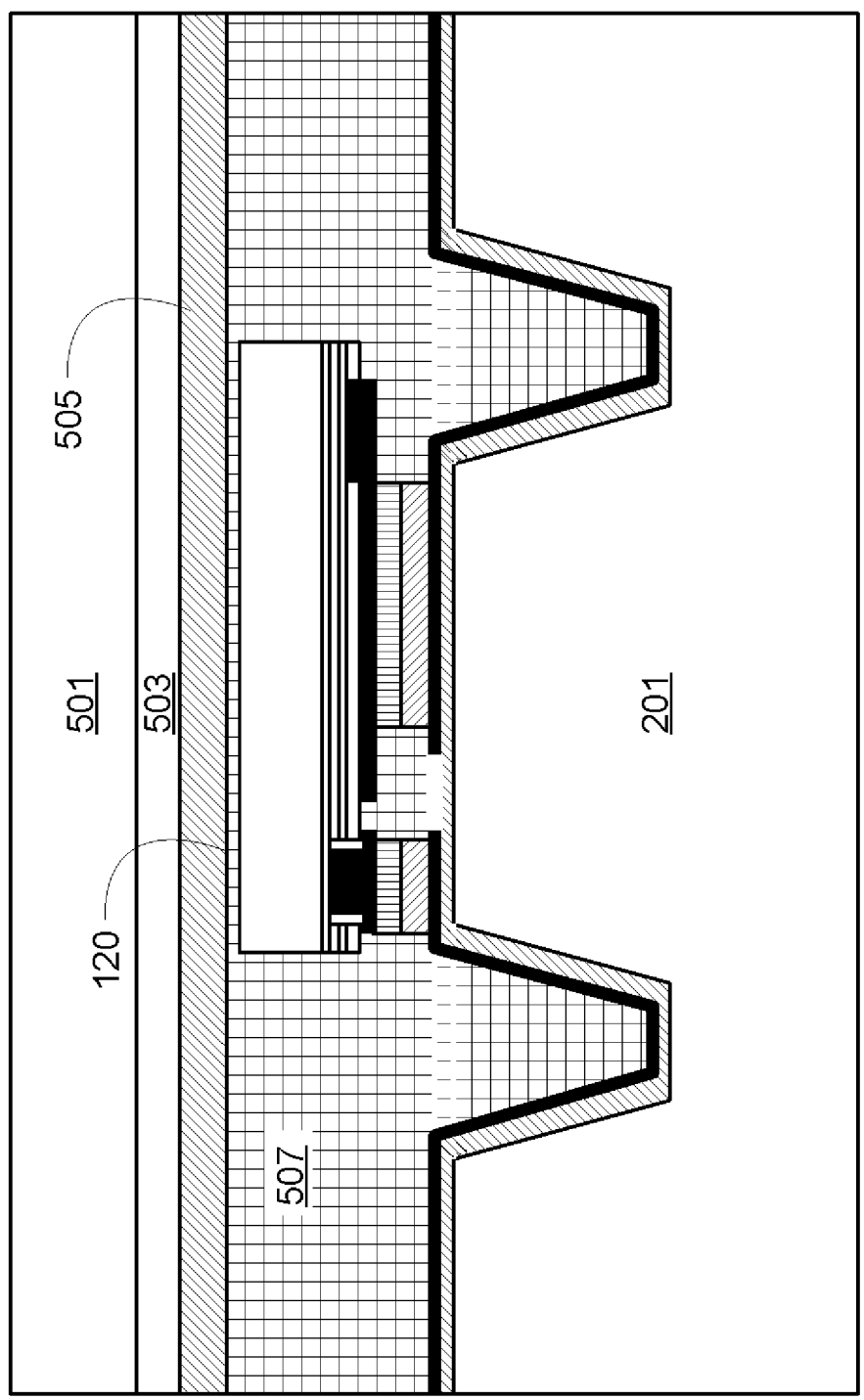
FIG. 5A shows an example of a LED bonded to a portion of the bottom wafer, an encapsulating layer around the LED, a layer with phosphor particles embedded in a Silicone matrix above the encapsulation layer and a portion of the top wafer attached to the phosphor embedded layer.

FIG. 5A shows an example of a LED (120) bonded to a portion of the bottom wafer (201), an encapsulating layer (507) around the LED (120), a layer with phosphor particles embedded in a Silicone matrix (phosphor embedded layer) (505) above the encapsulation layer (507) a bonding layer (503) and a portion of the top wafer (501) attached to the phosphor embedded layer (505). The encapsulating layer (507) and the phosphor embedded layer (505) are collectively referred to as functional optical layers. In one example, after the bonding step described in reference to FIG. 4, the bottom wafer (201) and bonded LEDs (120) are encapsulated in the encapsulating layer (507) such as a Silicone material. The material covers all the LEDs. After the material is cured, in one example, the top part of the material can be planarized by using a mechanical or chemical process such as grinding or etching. In another example, the Silicone can be injection molded over the LEDs (120) and bottom wafer (201) and the top part is flat as part of the injection mold process. In another example, the top of the encapsulating layer (507) can be coated with the phosphor embedded layer (505) which may be a additional Silicone layer that can contain fluorescent materials, Quantum dots, beads, or other particles with optical functionality. Examples of optical functionality include; changing a portion of the frequency of the impinging light; emitting a new wavelength of light; focusing of light; diffusion of light; and changing the polarization of the light. The optical functional layers (503, 505, 507) can be deposited in an even manner across the wafer, or can be selectively deposited or patterned so that only portions of the wafer are covered. In another example the encapsulation layer material is optically transparent. In another example the encapsulation layer material contains fluorescent materials. In another example the encapsulation layer material contains multiple layers of different material compositions including layers with fluorescent materials. In another example the encapsulation layer material contains non-contiguous volumes with fluorescent materials.

A bonding layer (503) is applied to either the top wafer (501) or to the phosphor embedded layer (505) or to both. The top wafer (501) is then attached to the bottom wafer (201), LEDs (120), and functional optical layers (507, 505, 503). In another example, the bonding layer (503) is deposited on the top cover wafer (501) and then bonded using a phosphor embedded layer (505) as described above.

Figure 5B:
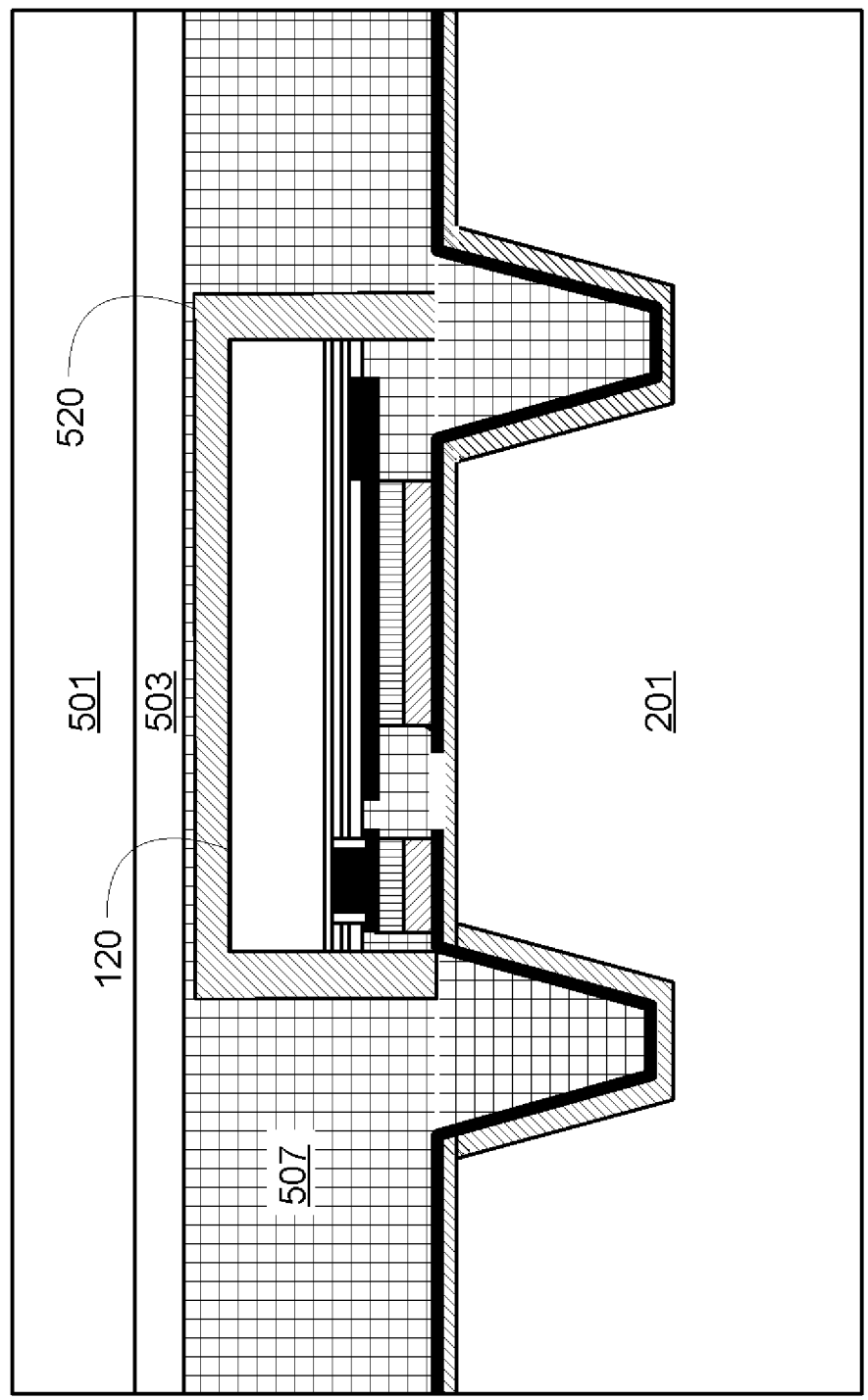
FIG. 5B shows an example of a LED bonded to a portion of the bottom wafer, a layer with phosphor particles embedded in a Silicone matrix around the LED, an encapsulating layer around the phosphor embedded layer and a portion of the top wafer.

FIG. 5B shows an example of a LED (120) bonded to a portion of the bottom wafer (201), a layer with phosphor particles embedded in a Silicone matrix around the LED (120), an encapsulating layer (507) around the phosphor embedded layer and a portion of the top wafer (501). The difference between FIG. 5B and FIG. 5A is that the optical functional layer, which can as an example be a Silicone with Phosphor particles, is in FIG. 5B conformal coated on the LED (120) while in FIG. 5A, the layer is coated on the encapsulation layer (507) or on the top wafer (501). As an example, the process described above is changed so that after the LED (120) to bottom wafer (201) bonding described in FIG. 4. The LEDs (120) on the wafer are conformal coated with a Silicone and Phosphor particle layer (also referred to as the coating layer) (520). After the coating, the LEDs (120), coating layer (520), and bottom wafer (201) are encapsulated by a Silicone material (507). The material covers all the LEDs. After the material is cured, in one example, the top part of the material can be planarized by using a mechanical, or chemical process such as grinding or etching. In another example, the Silicone can be injection molded over the LEDs (120) and bottom wafer (201) and the top part is flat as part of the injection mold process. A bonding layer (503) is applied to either the top wafer (501) or to the encapsulation layer (507) or to both. The top wafer (501) is then attached to the bottom wafer (201), LEDs (120), and optical layers (507, 515, 503).

Figure 5C:
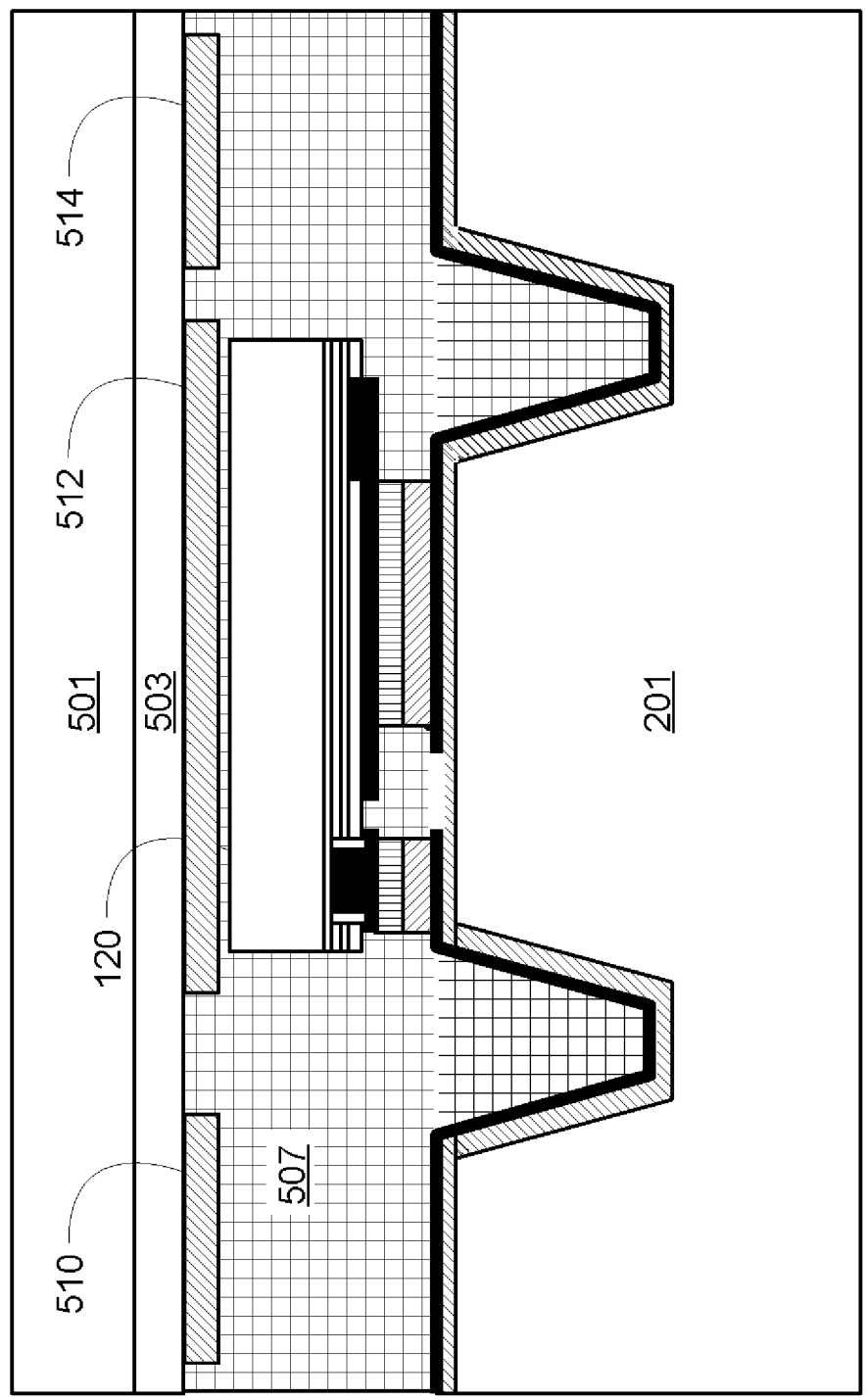
FIG. 5C shows an example of a LED bonded to a portion of the bottom wafer, an encapsulating layer around the LED, enclosed volumes with phosphor particles embedded in a Silicone matrix above the encapsulation layer and a portion of the top wafer attached to the phosphor embedded layer.

FIG. 5C shows an example of a LED (120) bonded to a portion of the bottom wafer (201), an encapsulating layer around the LED (507), enclosed volumes with phosphor particles embedded in a Silicone matrix above the encapsulation layer (510, 512, 514) and a portion of the top wafer attached to the phosphor embedded layer. In contrast to Silicone layer 505 of FIG. 5A the enclosed volumes (510, 512, 514) in FIG. 5C provide isolated regions of optical functionality. In one example the volumes are comprised of phosphor particles embedded in Silicone matrix. In another example, one enclosed volume (510) can contain a different species of phosphor material than the second enclosed volume (512) and the third enclosed volume (514). In another example each enclosed volume (510, 512, 514) can provide one or more different optical functionality such as focusing, defocusing, fluorescence or reflection. In another example, the length and or width of an enclosed volume (512) containing phosphor or quantum dot material can be larger than the LED. In another example, the length and or width of an enclosed volume (512) containing phosphor or quantum dot material can be smaller than the LED. In another example enclosed volumes (510, 512, 514) or layers (505 in FIG. 5A) can be composed of multiple layers or materials.

The examples described in FIG. 5A, FIG. 5B, and FIG. 5C provide an optical function. Either of these examples can be used for the electrical and thermal connection part of the process. In one example the bonding layer is optically transparent. In another example the difference in the refractive index of the bonding layer and the encapsulation layer is smaller than 0.2. In another example the refractive index and thickness of the bonding layer reduce the optical reflection of light emitted from the diode at the interface between the bonding layer and the top cover wafer. In another example the top cover wafer is optically transparent. In another example the top cover wafer is one of Glass, Quartz, Sapphire, PMMA, polycarbonate, or Silicone or combinations of these materials. In one example the top cover wafer surface is substantially flat. In another example the top cover wafer surface is curved. In another example the top cover wafer includes an optical element. The optical element can include lens, grating, polarizer, Fresnel lens, surface Plasmon gratings or structures. In another example the top cover wafer includes a light dispersing element.

Figure 6A:
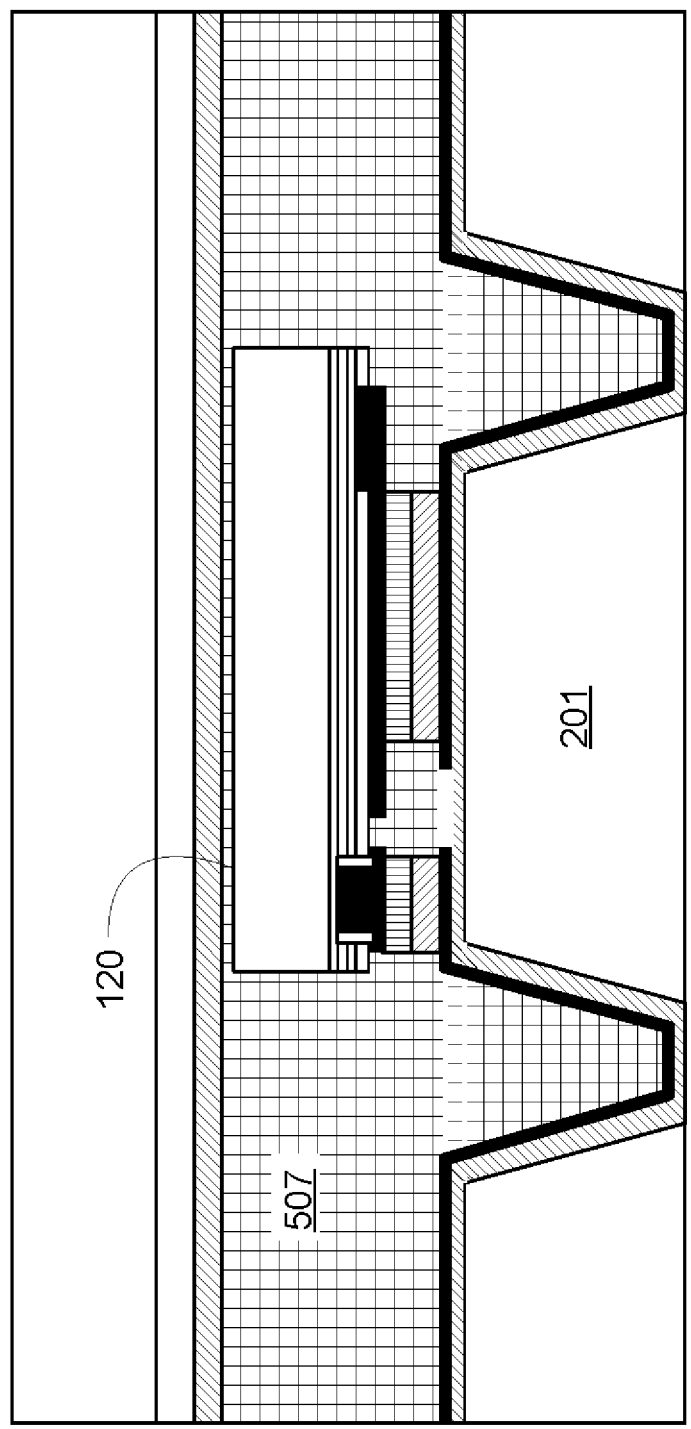
FIG. 6A shows an example of a LED and portions of the wafers of FIG. 5A with a reduced bottom wafer height.
Figure 6B:
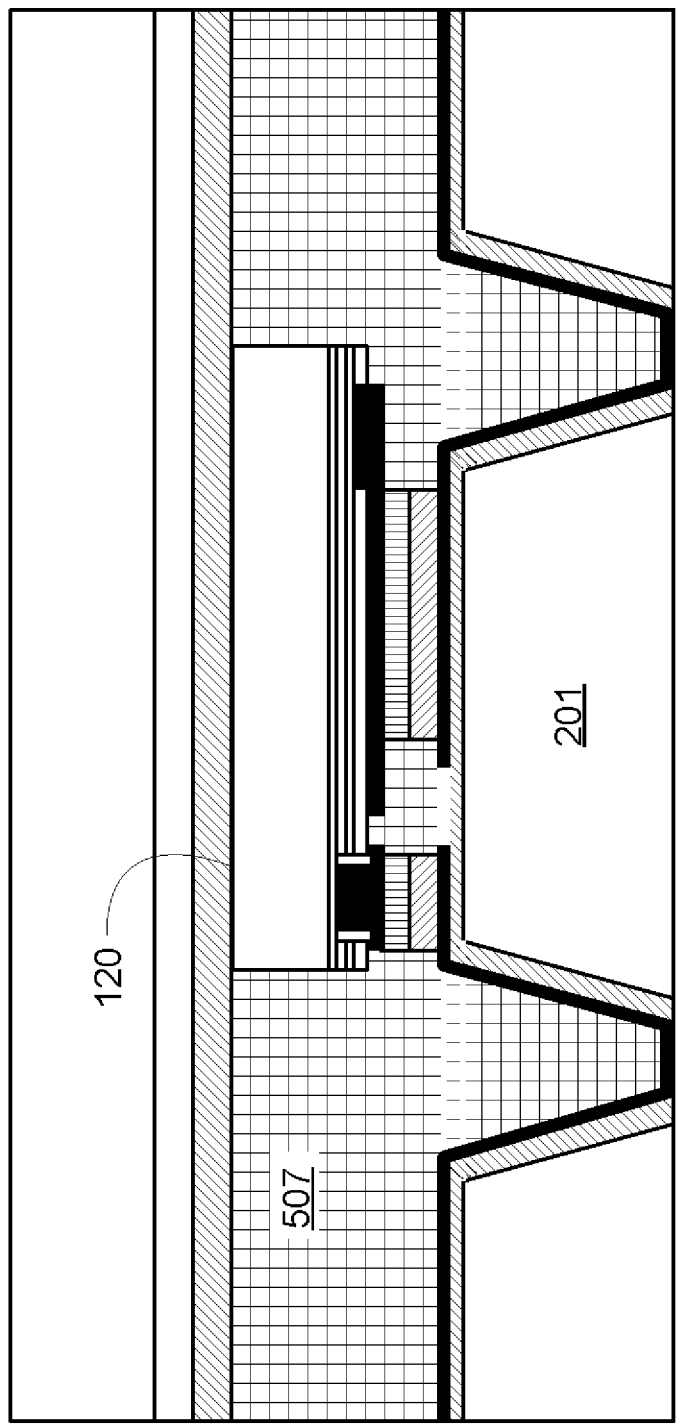
FIG. 6B shows another example of a LED and portions of the wafers of FIG. 5A with a reduced bottom wafer height.

FIG. 6A shows an example of a LED (120) and portions of the wafers (201, 501) of FIG. 5A with a reduced bottom wafer height or the thickness of the bottom wafer. However FIG. 6A as well as the rest of the examples shown in FIG. 6-9 can use FIG. 5B or FIG. 5C or combinations of FIG. 5A and FIG. 5B and FIG. 5C. An example of reducing the bottom wafer (201) height or thickness is a grinding process. The process can also include a wet etching step as well as a plasma etching step. The height of the bottom wafer (201) is reduced to expose the lower part of the holes (210, 212 in FIG. 2) in the bottom wafer (201). Since the holes (210, 212 in FIG. 2) have a passivation layer (207) and metal pad (203, 205), one or more of the metal pads (203, 205) will be exposed as part of the material removal of the bottom wafer (201). FIG. 6A is an example where the height of the bottom wafer is reduced so as to reveal the passivation layer (207) in the holes (210, 212 in FIG. 2). FIG. 6B is an example where the height of the bottom wafer is reduced so as to reveal the metal pads (203, 205) in the holes (210, 212 in FIG. 2).

Figure 7A:
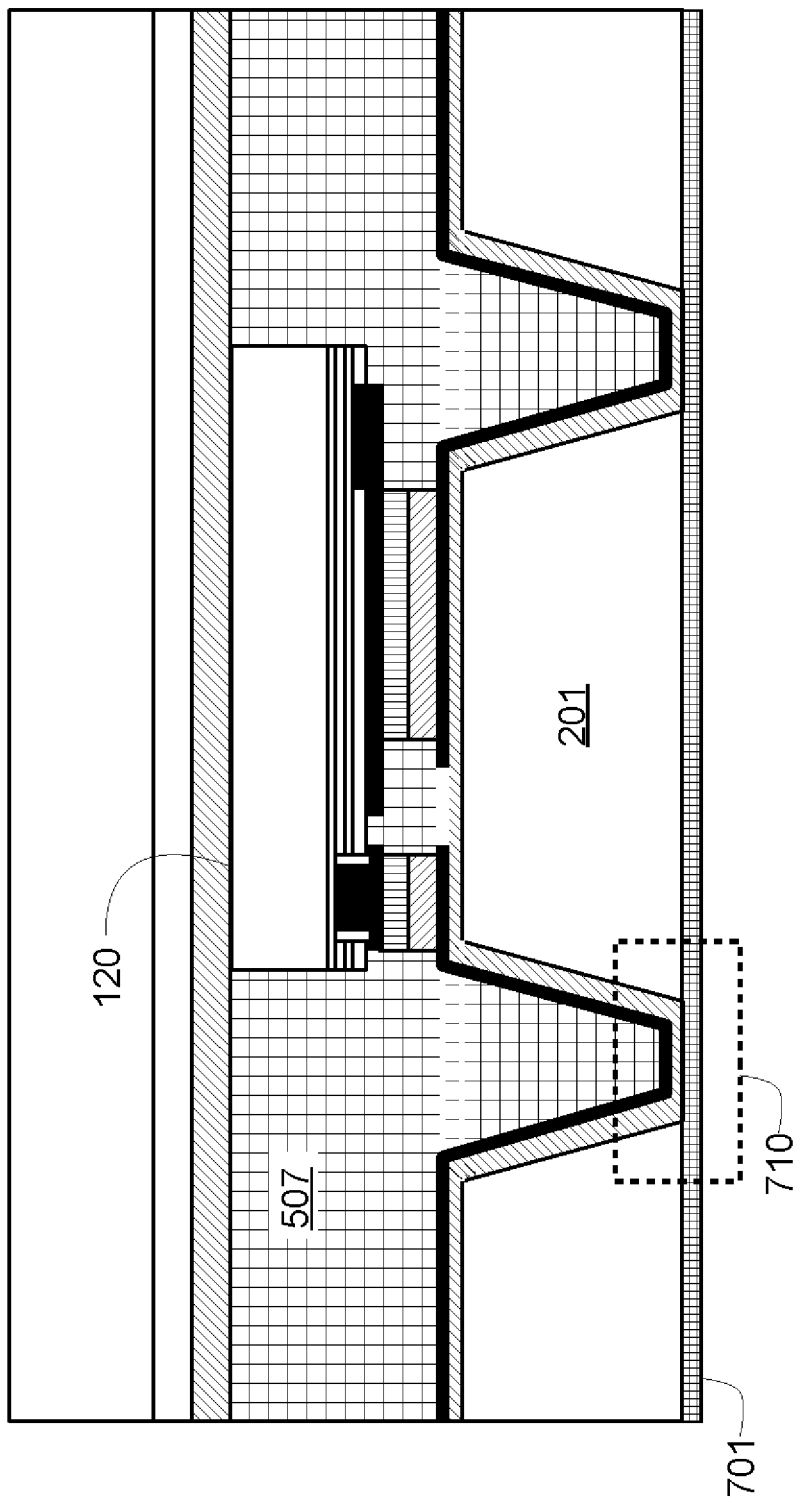
FIG. 7A shows an example of a LED and portions of the wafers of FIG. 6A with an isolation layer on the bottom wafer.
Figure 7B:
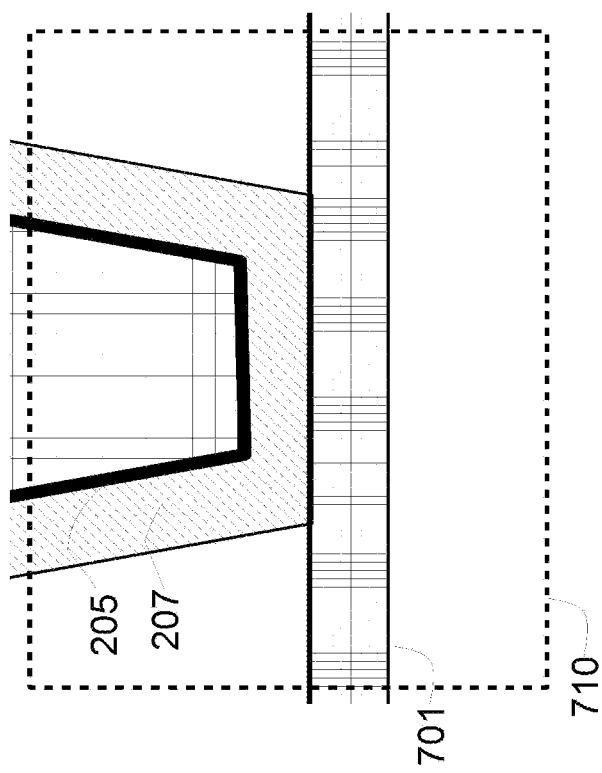
FIG. 7B is a close up of the cutout portion in FIG. 7A.
Figure 7C:
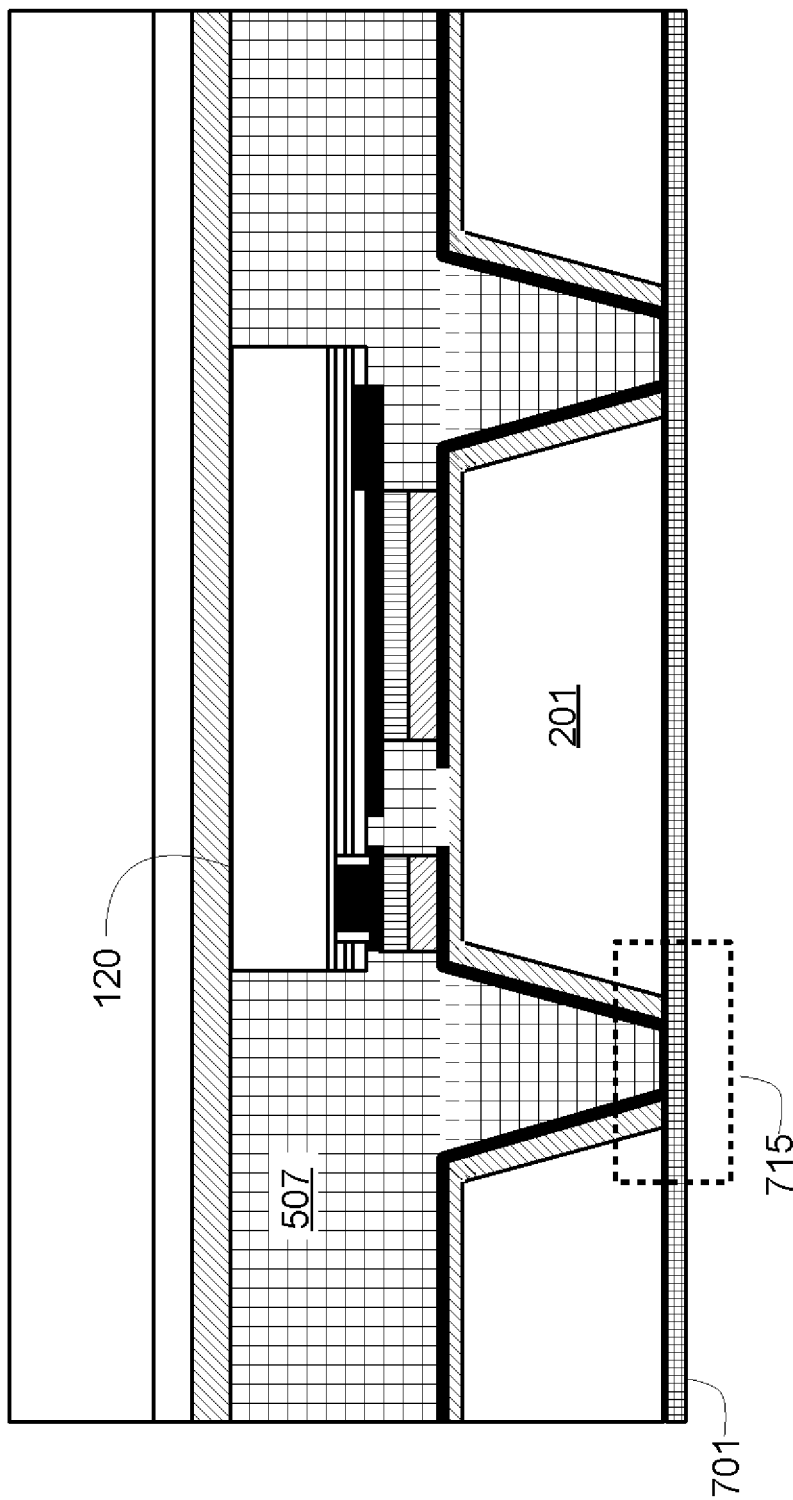
FIG. 7C shows an example of a LED and portions of the wafers of FIG. 6B an isolation layer on the bottom wafer.
Figure 7D:
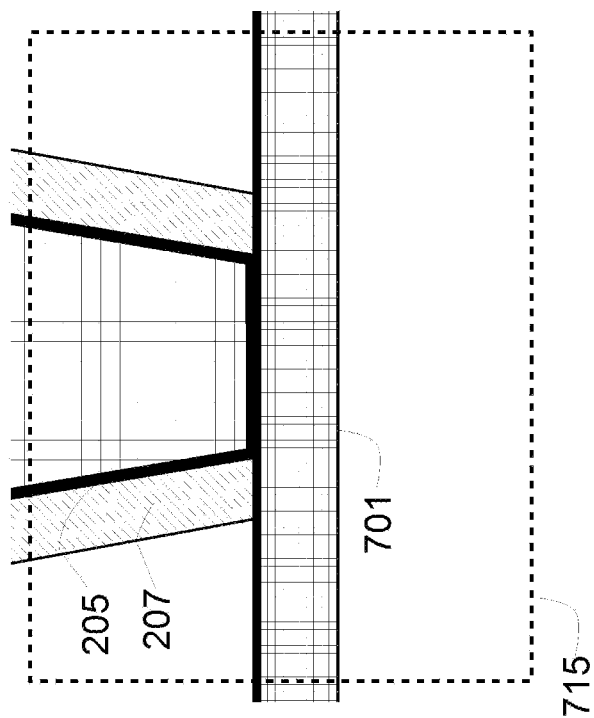
FIG. 7D is a close up of the cutout portion in FIG. 7C.

FIG. 7A shows an example of a LED (120) and portions of the wafers (201, 501) of FIG. 6A with an isolation layer (701) on the bottom wafer (201). The isolation layer (701) covers the bottom wafer (201) and the exposed parts of the passivation layer (207). FIG. 7B is a close up of the cutout portion (710) in FIG. 7A. In one example, the isolation layer (701) is in contact with the metal pad (203). FIG. 7C shows an example of a LED (120) and portions of the wafers (201, 501) of FIG. 6B with an isolation layer (701) on the bottom wafer (201). The isolation layer (701) covers the bottom wafer (201) and the exposed parts of the passivation layer (207) and metal pad (203, 205). The isolation layer (701) can be Silicon dioxide, Silicon Nitride, Silicon Carbide, polymer materials such as epoxy, polyamide, Silicone, photo resist, solder mask or combinations of these materials. The thickness of the isolation layer (701) can vary from 0.1 micron for materials such as Silicon Nitride, to thickness of 1 micron for Silicon Oxide and a more than 2 micron for polymers. FIG. 7D is a close up of the cutout portion ((715) in FIG. 7C. In one example, the isolation layer (701) is in contact with the passivation layer (207).

Figure 8A:
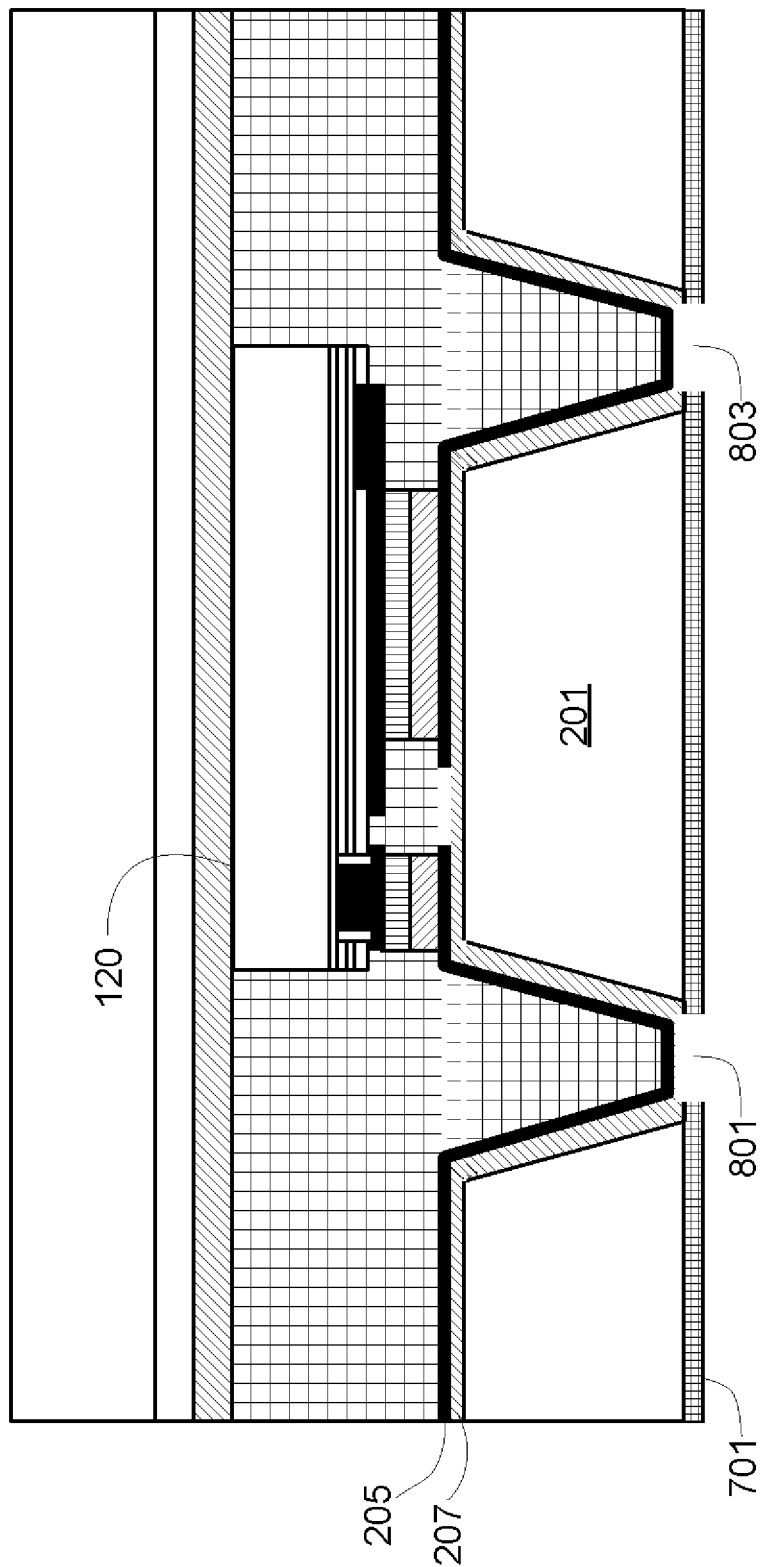
FIG. 8A shows an example of a LED and portions of the wafers of FIG. 7A with holes in the isolation layer.
Figure 8B:
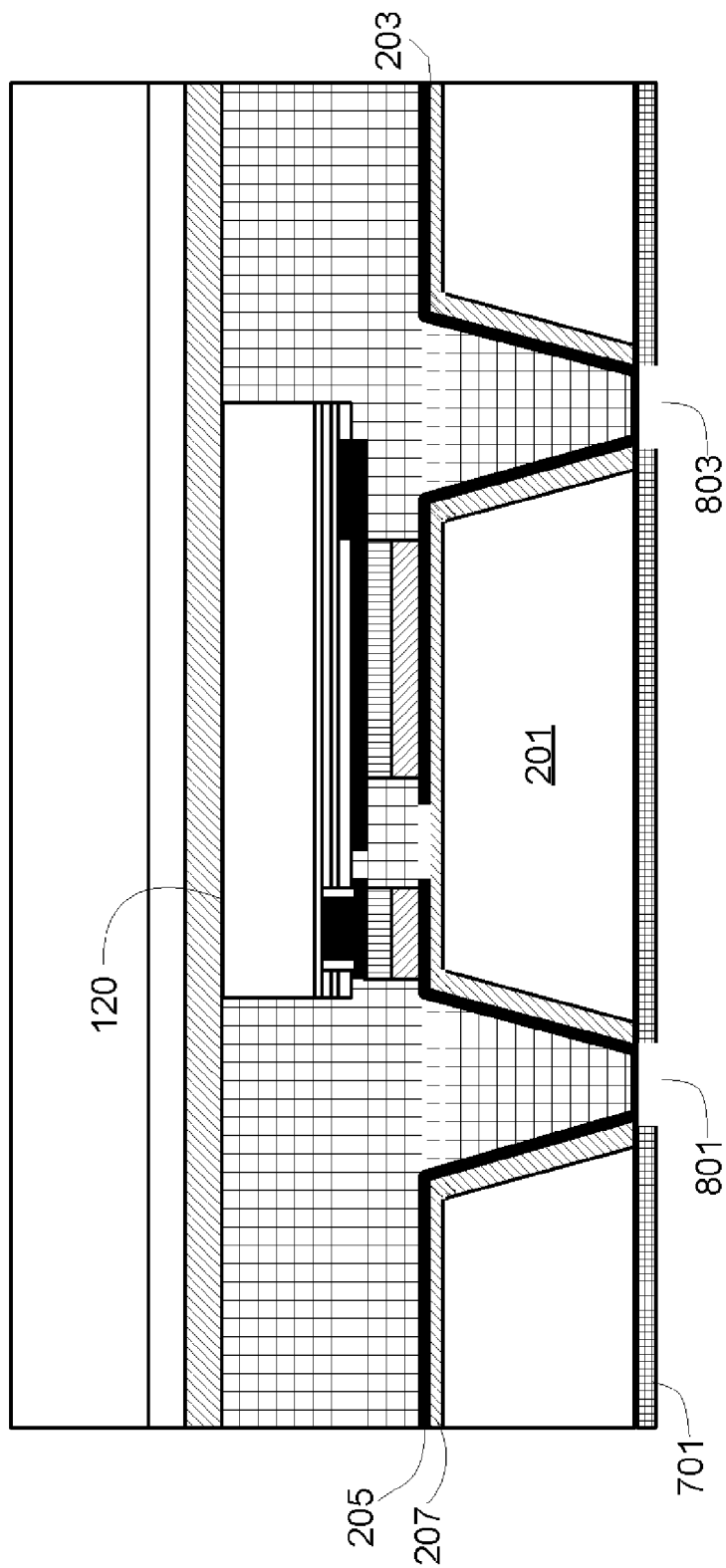
FIG. 8B shows another example of a LED and portions of the wafers of FIG. 7B with holes in the isolation layer.

FIG. 8A shows an example of a LED (120) and portions of the wafers (201, 501) of FIG. 7A with holes (801, 803) in the isolation layer (701). FIG. 8B shows an example of a LED (120) and portions of the wafers (201, 501) of FIG. 7B with holes (801, 803) in the isolation layer (701). The holes (801, 803) can be fabricated by applying a photo resist layer to the isolation layer (701); exposing the photo resist with a mask; removing the exposed parts to define holes; etching the isolation layer (701) using either a wet process or a plasma process.

Figure 9:
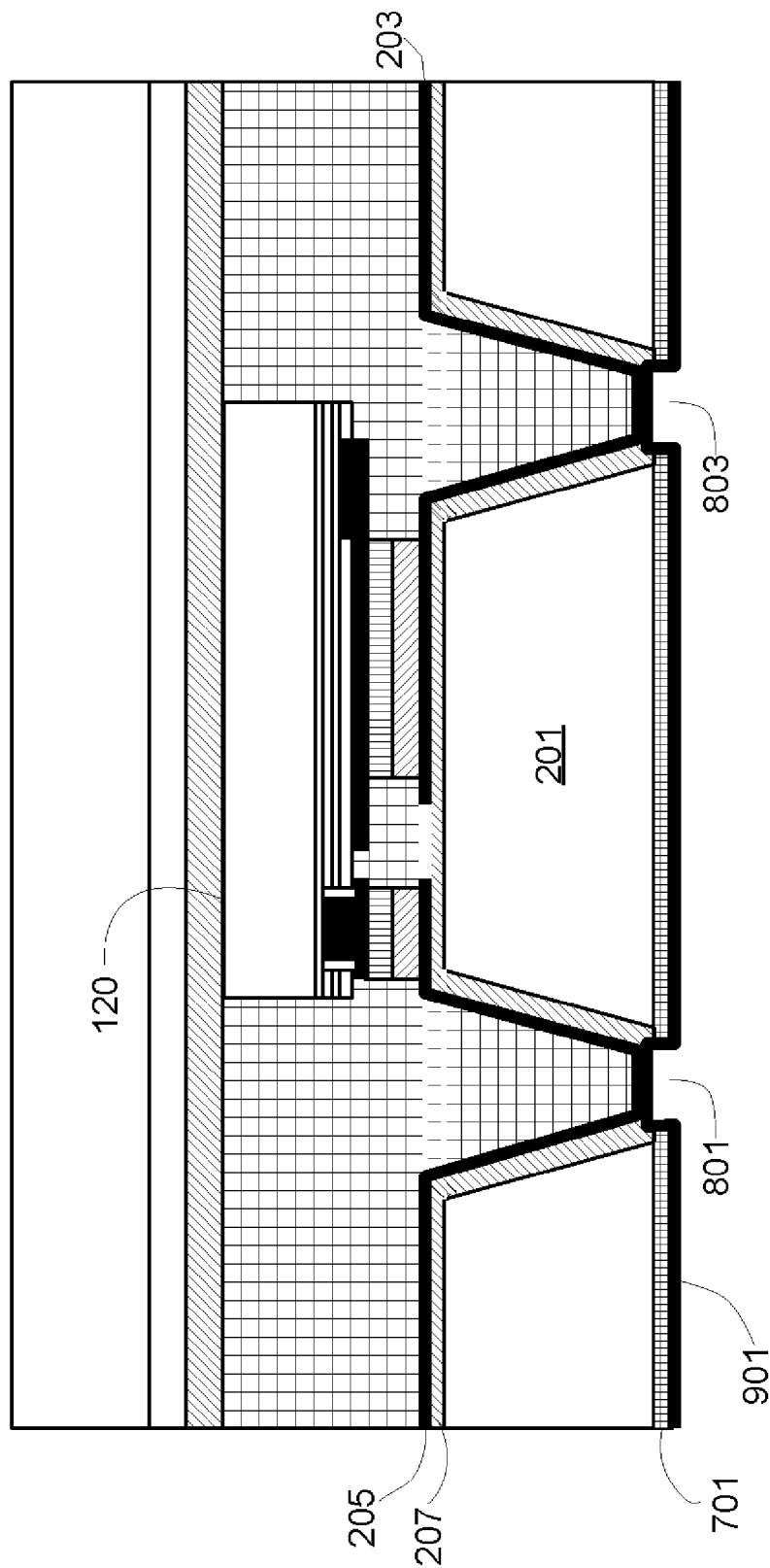
FIG. 9 shows an example of a LED and portions of the wafers of FIG. 8A with a metal layer covering the isolation layers and holes.
Figure 10:
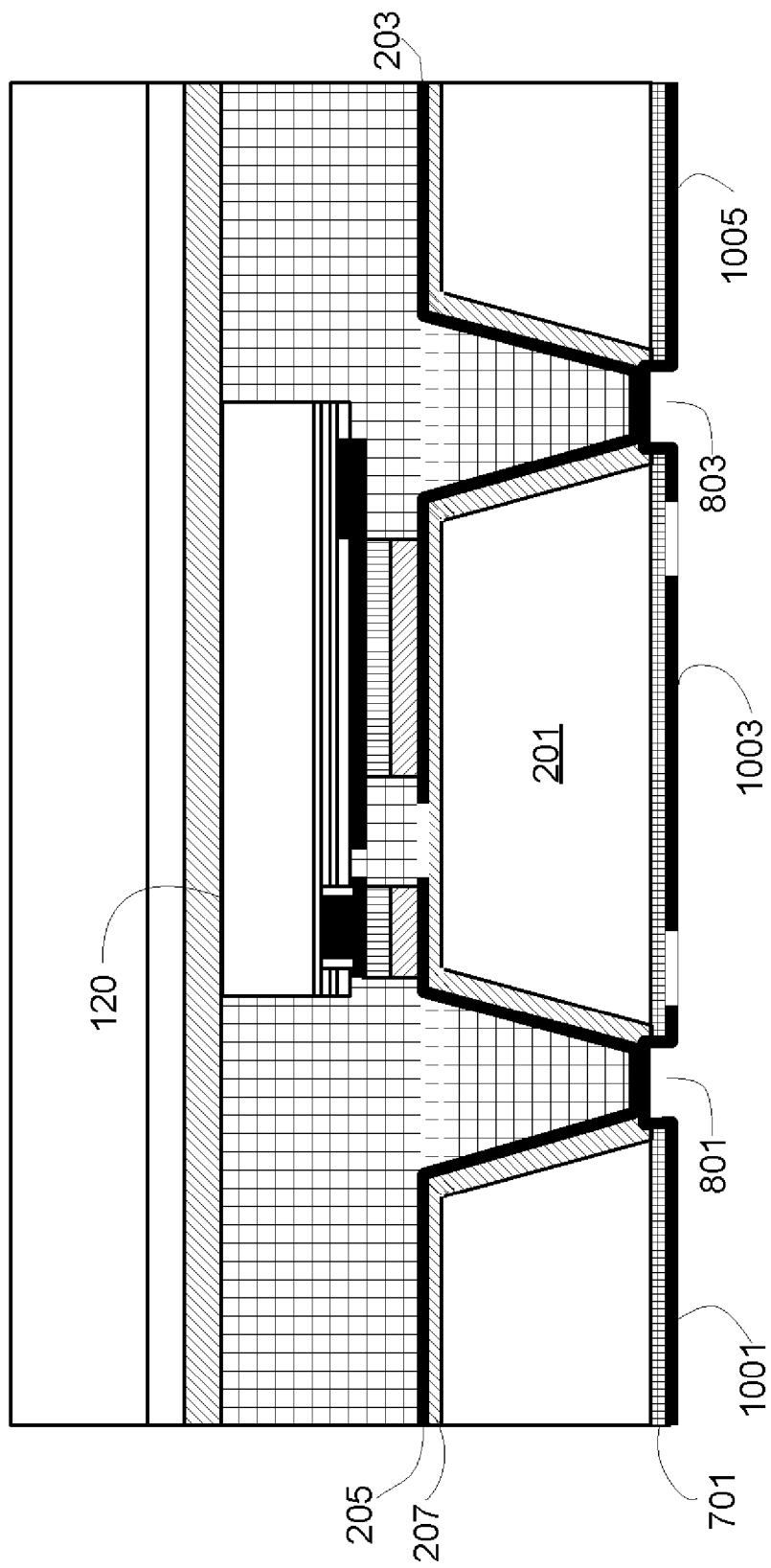
FIG. 10 shows an example of a LED and portions of the wafers of FIG. 9 with patterns defined in the metal layer.

FIG. 9 shows an example of a LED (120) and portions of the wafers (201, 501) of FIG. 8A with a metal layer (901) covering the isolation layer (701) and holes (801, 803). The metal layer (901) is electrically connected to metal pads (203, 205). Examples of materials for the metal layer (901) are, Aluminum, Copper, Gold, Titanium, Chromium or combinations of these materials. FIG. 10 shows an example of a LED (120) and portions of the wafers (201, 501) of FIG. 9 with patterns (1001, 1003, 1005) defined in the metal layer (901 in FIG. 9). An example of fabrication of the metal layer (901 in FIG. 9) and patterns (1001, 1003, 1005) using a two-step process; Initially a metal layer (901) such as Aluminum is applied across the wafer; a layer of photo resist is applied on this metal layer (901); the photo resist is patterned using a lithography system creating holes in the areas of (1001, 1003, 1005); in the second step a second layer of metal is selectively electroplated in exposed areas creating electroplated structures (1001, 1003, 1005); the photo resist is removed and the initial metal layer is etched using the electroplated structures (1001, 1003, 1005) as a mask.

In one example the electroplated structures are composed of a seed metal layer and an electroplated metal layer. In another example the seed metal layer (901) can be a layer of Aluminum with a thickness from 0.5 to 5 micron. An example of an electroplated layer can be Copper, Nickel, or combinations of Copper and Nickel with a thickness of 5 to 40 micron.

Figure 11:
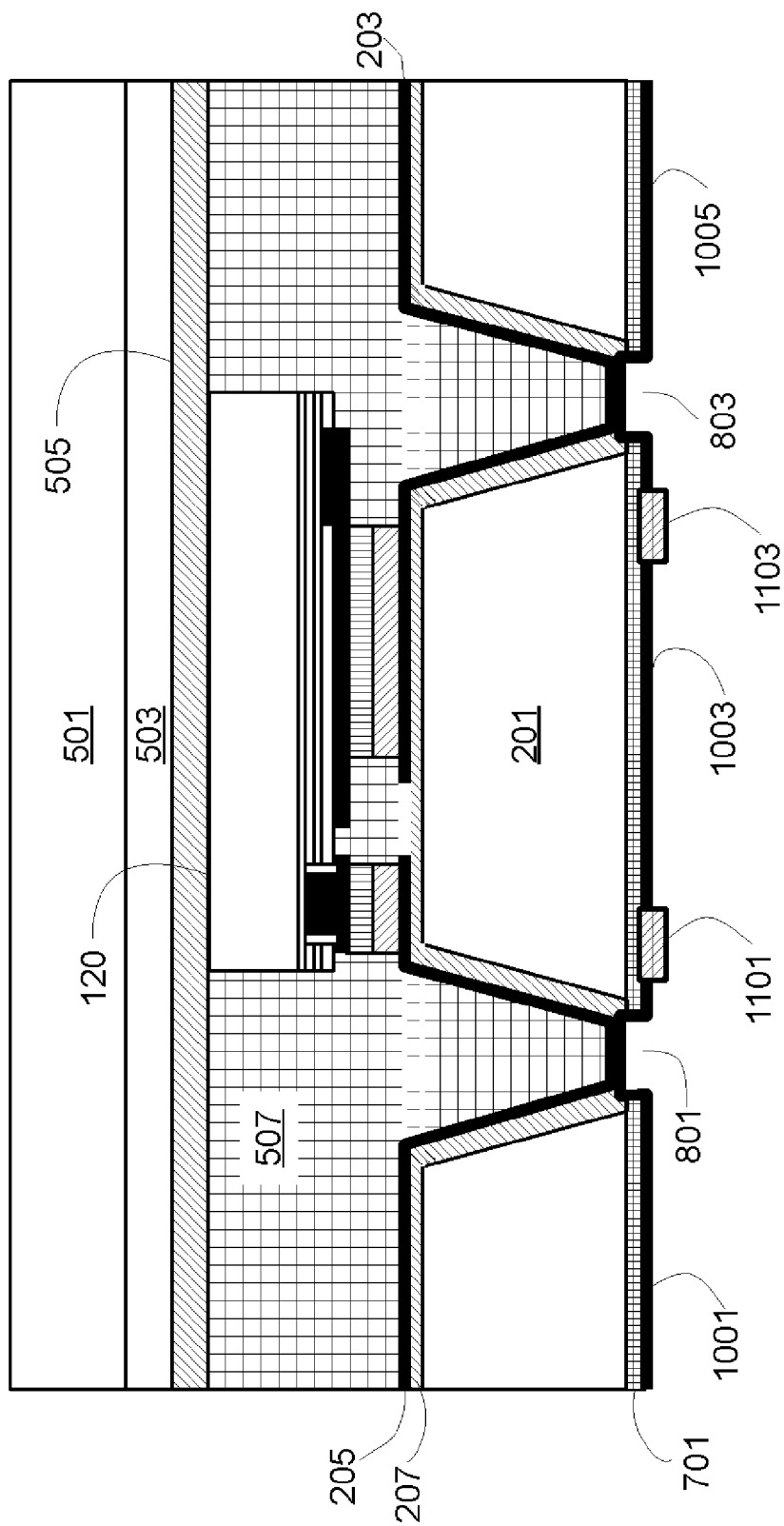
FIG. 11 shows an example of a LED and portions of the wafers of FIG. 10 with dielectric material deposited between the metal patterns.

FIG. 11 shows an example of a LED (120) and portions of the wafers (201, 501 of FIG. 10) with a dielectric material (1101, 1103) deposited between the metal patterns. An example of a dielectric material (1101, 1103) is solder mask and it can be applied using a screen printing technique.

The resulting structure is composed of a bottom wafer (201) with holes (210, 212 in FIG. 2); a passivation layer (207) in contact with bottom wafer (201); metal pads (203, 205) in contact with passivation layer (207); bond pads (301, 303, 305, 307 in FIG. 3) in contact with metal pads (203, 205); a LED (120) attached to at least one bond pad (301, 303, 305, 307 in FIG. 3); one or more encapsulation layers (505, 507) in contact with the LED (120); a bonding layer (503) in contact with the encapsulation layer (505, 507); a top wafer (501) in contact with the bonding layer (503); an isolation layer (701) in contact with bottom wafer (201); electroplated structures (1001, 1003, 1005) in contact with the isolation layer (701); whereas the metal pads (203, 205) extend into the hole in the bottom wafer and are in contact with the electroplated structures (1001, 1003, 1005) forming an electrical connection between the LED electrical pads (112, 116 in FIG. 1) and electroplated structures (1001, 1003, 1005). In one example the LED is a flip chip LED. In another example the flip chip LED is attached using a Eutectic bonding, Transient Liquid phase bonding, thermo compression bonding, or soldering. In another example the bottom wafer material is one of Silicon, Ceramic, Polymer, Epoxy, Glass Fiber, of Silicon Carbide. In another example the passivation layer material is one of Silicon dioxide, Silicon Nitride, Silicon Carbide, Polymer, Epoxy, or Silicone. In another example the passivation layer material is one of Silicon dioxide, Silicon Nitride, Silicon Carbide, Polymer, Epoxy, or Silicone.

In another example the method of packaging a semiconductor device is comprised of a bottom wafer with holes (201); a passivation layer (207) in contact with bottom wafer (201); metal pads (203, 205) in contact with passivation layer (207); bond pads (301, 303, 305, 307 in FIG. 3) in contact with metal pads (203, 205); attaching a LED device (120) to a bond pad (301, 303, 305, 307 in FIG. 3); applying an encapsulation layer (505, 507) in contact with the LED (120); attaching top wafer (501) to encapsulation layer (505, 507); reducing the height of the bottom wafer (201) to reveal the material in the holes; applying an isolation layer (701) to the bottom wafer (201); defining holes (801, 803) in the isolation layer to reveal the metal pads (203, 205); and applying electroplated structures (1001, 1003, 1005) in contact with the isolation layer (701) and in contact with the metal pad (203, 205). In another example the method of wafer level packaging a LED comprising of; a bottom wafer (201) with blind vias (210, 212 in FIG. 2); a passivation layer (207) in contact with bottom wafer (201); metal pads (203, 205) in contact with passivation layer (207); bond pads (301, 303, 305, 307 in FIG. 3) in contact with metal pads (203, 205); attaching a LED device (120) to the bond pad (301, 303, 305, 307 in FIG. 3); applying an encapsulation layer (505, 507) in contact with the LED (120); attaching top wafer (501) to encapsulation layer (505, 507); reducing the height of the bottom wafer to expose the passivation layer (207); applying an isolation layer (701) to the bottom wafer (201); defining holes (801, 803) in the isolation layer (701) and passivation layer (207) to expose the metal pads (203, 205); and forming electroplated structures (1001, 1003, 1005) in contact with the isolation layer (701) and in contact with the metal pad (203, 205).

Figure 12:
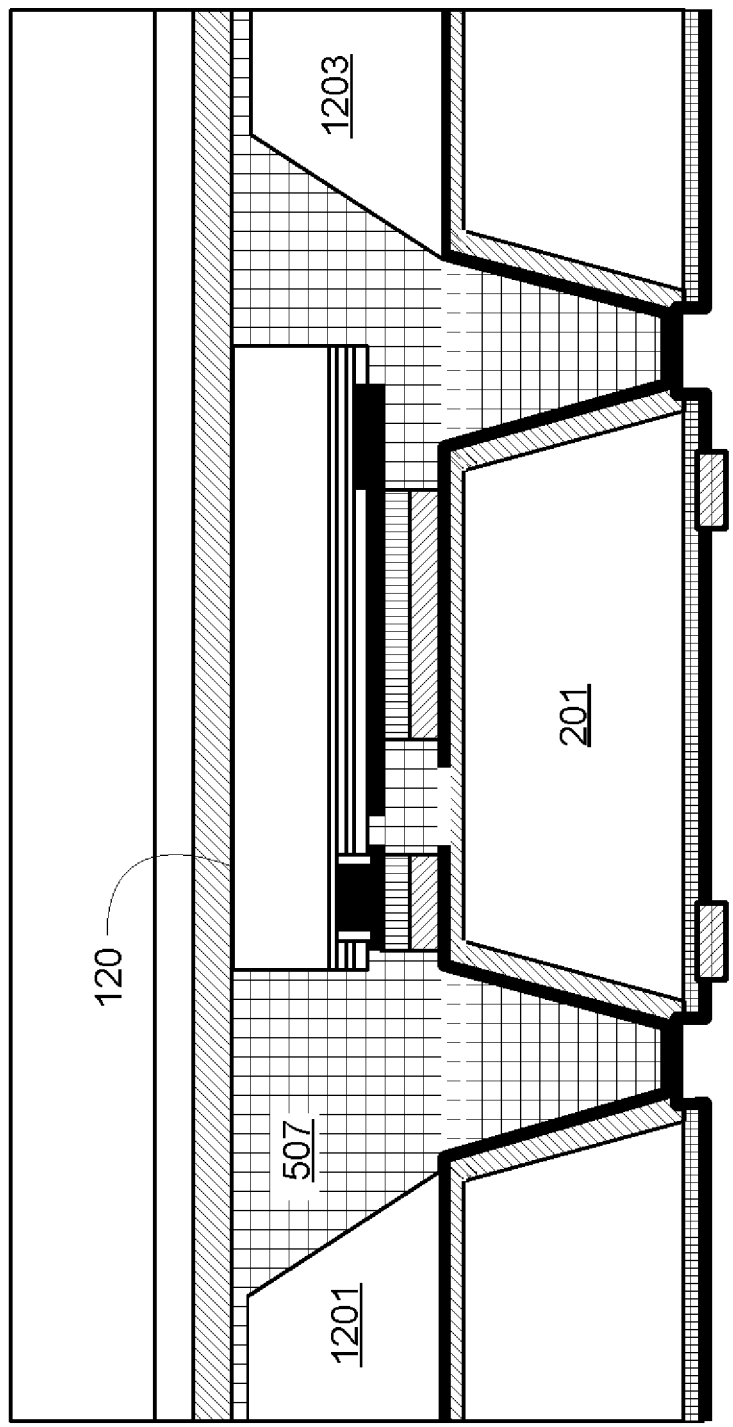
FIG. 12 shows an example of a LED and portions of the wafers of FIG. 11 with optical reflecting elements.

FIG. 12 shows an example of a LED (120) and portions of the wafers (201, 501) of FIG. 11 with optical reflecting elements (1201, 1203); The optical reflecting elements (1201, 1203) can be added on the wafer after bonding the LED (120) or before bonding the LED (120). The elements can be fabricated from a Silicon wafer, a polymer or glass wafer. In one example the optical reflecting elements (1201, 1203) are coated with a metal reflecting layer such as Aluminum, Silver or Gold. In another example the optical reflecting elements (1201, 1203) can also be coated with dielectric layers as a reflective stack or as protective coating for the metal reflective layers. In another example the reflecting layers can be composed or coated with Polytetrafluoroethylene (PTFE), or coated with Magnesium Oxide or Barium Sulfide.

The invention claimed is:
1. An LED wafer level package comprising:
a bottom wafer with one or more vias;
a passivation layer in contact with the bottom wafer;
one or more metal pads in contact with the passivation layer;
one or more bond pads in contact with the one or more metal pads;
an LED attached to at least one of the one or more bond pads;
one or more encapsulation layers in contact with the LED;
a bonding layer in contact with the one or more encapsulation layers;
a top wafer in contact with the bonding layer;
an isolation layer in contact with the bottom wafer; and
electroplated structures in contact with the isolation layer;
wherein the one or more metal pads extend into the one or more vias of the bottom wafer and are in contact with the electroplated structures forming an electrical connection between the LED attached to the at least one bond pad and the electroplated structures.
2. The LED wafer level package according to claim 1, wherein the LED is a flip chip LED.

3. The LED wafer level package according to claim 1, wherein a bottom wafer comprises a material that is one of Silicon, Ceramic, Polymer, Epoxy, Glass Fiber, of Silicon Carbide.

4. The LED wafer level package according to claim 1, wherein the passivation layer comprises a material that is one of Silicon dioxide, Silicon Nitride, Silicon Carbide, Polymer, Epoxy, or Silicone.

5. The LED wafer level package according to claim 1, wherein the one or more encapsulation layers comprise a material that is optically transparent.

6. The LED wafer level package according to claim 1, wherein the one or more encapsulation layers comprise a material that is optically transparent and contains fluorescent materials.

7. The LED wafer level package according to claim 1, wherein the one or more encapsulation layers comprise a material that contains fluorescent materials.

8. The LED wafer level package according to claim 1, wherein the one or more encapsulation layers comprise a material that contains multiple layers of different material compositions including layers with fluorescent materials.

9. The LED wafer level package according to claim 1, wherein the one or more encapsulation layers comprise a material that contains non-contiguous volumes with fluorescent materials.

10. The LED wafer level package according to claim 1, wherein the one or more encapsulation layers comprise a material that contains non-contiguous volumes with different fluorescent materials.

11. The LED wafer level package according to claim 1, wherein the bonding layer is optically transparent.

12. The LED wafer level package according to claim 1, wherein a difference in refractive indices of the bonding layer and encapsulation layer is smaller than 0.2.

13. The LED wafer level package according to claim 1, wherein a refractive index and a thickness of the bonding layer reduce optical reflection of light emitted from a diode at an interface between the bonding layer and the top wafer.

14. The LED wafer level package according to claim 1, wherein the top wafer is optically transparent.

15. The LED wafer level package according to claim 1, wherein a material of the top wafer is one of Glass, Quartz, Sapphire, PMMA, polycarbonate, or Silicone or combinations of these materials.

16. The LED wafer level package according to claim 1, wherein a surface of the top wafer is substantially flat.

17. The LED wafer level package according to claim 1, wherein a surface of the top wafer is curved.

18. The LED wafer level package according to claim 1, wherein the top wafer includes an optical element.

19. The LED wafer level package according to claim 1, wherein the top wafer includes a light dispersing element.

20. The LED wafer level package according to claim 1, wherein the electroplated structures are composed of a seed metal layer and an electroplated metal layer.

* * * * *